(12) United States Patent  
Jitsuno et al.

(10) Patent No.: US 7,919,366 B2
(45) Date of Patent: Apr. 5, 2011

(54) LASER CRYSTALLIZATION METHOD FOR AMORPHOUS SEMICONDUCTOR THIN FILM

(75) Inventors: Takahisa Jitsuno, Osaka (JP); Keiu Tokumura, Osaka (JP); Ryotaro Togashi, Kanagawa (JP); Toshio Inami, Kanagawa (JP); Hideaki Kusama, Kanagawa (JP); Tatsumi Goto, Kanagawa (JP)

(73) Assignees: Osaka University, Osaka (JP); The Japan Steel Works, Ltd., Tokyo (JP)

( * ) Notice: Subject to any disclaimer, the term of this patent is extended or adjusted under 35 U.S.C. 154(b) by 0 days.

(21) Appl. No.: 12/576,938

(22) Filed: Oct. 9, 2009

(65) Prior Publication Data

US 2010/0093182 A1 Apr. 15, 2010

(30) Foreign Application Priority Data

Oct. 14, 2008 (JP) ................................ 2008-265612

(51) Int. Cl.
*H01L 21/268* (2006.01)
(52) U.S. Cl. .............. 438/166; 438/487; 117/8; 117/10; 117/904
(58) Field of Classification Search .................. 438/166, 438/487; 117/8, 10, 904
See application file for complete search history.

(56) References Cited

U.S. PATENT DOCUMENTS

| | | | | |
|---|---|---|---|---|
| 4,822,752 A | * | 4/1989 | Sugahara et al. | 117/43 |
| 5,445,923 A | * | 8/1995 | Takahashi et al. | 430/340 |
| 5,994,164 A | * | 11/1999 | Fonash et al. | 438/97 |
| 6,632,749 B2 | * | 10/2003 | Miyasaka et al. | 438/788 |
| 6,683,188 B1 | * | 1/2004 | Kasada et al. | 548/181 |
| 7,192,818 B1 | * | 3/2007 | Lee et al. | 438/166 |
| 7,470,604 B2 | * | 12/2008 | Fujii | 438/538 |
| 7,615,488 B2 | * | 11/2009 | Maekawa et al. | 438/674 |
| 7,651,896 B2 | * | 1/2010 | Honda et al. | 438/149 |
| 7,706,423 B2 | * | 4/2010 | Kume et al. | 372/50.121 |
| 2006/0088986 A1 | * | 4/2006 | Lin et al. | 438/482 |
| 2008/0070386 A1 | * | 3/2008 | Kim et al. | 438/487 |
| 2008/0070393 A1 | * | 3/2008 | Miyairi et al. | 438/585 |
| 2010/0075487 A1 | * | 3/2010 | Bouchut | 438/487 |

FOREIGN PATENT DOCUMENTS

| | | | |
|---|---|---|---|
| JP | 63-142810 | * | 6/1988 |
| JP | 2-7415 | * | 1/1990 |
| JP | 2004-134577 A | | 4/2004 |
| JP | 2005-191470 | * | 7/2005 |

* cited by examiner

*Primary Examiner* — Mary Wilczewski
(74) *Attorney, Agent, or Firm* — Griffin & Szipl, P.C.

(57) ABSTRACT

A laser crystallization method in which an amorphous silicon thin film 2 formed on a substrate 1 is irradiated with a laser beam, the method including the steps of providing the amorphous silicon thin film 2 with an absorbent to form an absorbent layer 3 on the desired specific local areas of the amorphous silicon thin film 2 and laser annealing for crystallizing the specific local areas of the amorphous silicon thin film 2 by irradiating the amorphous silicon thin film 2 including the specific local areas with a semiconductor laser beam L having a specific wavelength absorbable by the absorbent layer 3 and unabsorbable by the amorphous silicon thin film 2 for heating the absorbent layer 3.

2 Claims, 2 Drawing Sheets

US 7,919,366 B2

LASER CRYSTALLIZATION METHOD FOR AMORPHOUS SEMICONDUCTOR THIN FILM

This application claims priority from Japanese Patent Application No. 2008-265612, filed Oct. 14, 2008, the entire disclosure of which is incorporated herein by reference.

BACKGROUND OF THE INVENTION

1. Field of the Invention

The present invention relates to a method for laser crystallization of an amorphous silicon thin film for forming a thin-film transistor or the like.

2. Description of Related Art

Conventionally, thin-film transistors that are applied to a variety of technical fields of TFT-LCDs, image sensors, touch-panel sensors, and the like are formed in an amorphous silicon thin film that is formed on a substrate; recently, however, various techniques are employed to crystallize the amorphous silicon thin film for the enhancement of response rate. The most widely used crystallization method is a laser annealing method in which an amorphous silicon thin film is irradiated with an excimer laser beam having a wavelength of 308 nm or a second harmonic YAG laser beam having a wavelength of 532 nm to crystallize the entire surface of the amorphous silicon thin film.

FIG. 5 is an explanatory drawing showing a typical conventional laser crystallization method. As shown in FIG. 5, the method of laser beam irradiation is such that the line beam L of an excimer laser is formed by constructing an optical system using an folding mirror 10, slits 11 and 12, an annealer window 13, and like components, and the substantially entire surface of an amorphous silicon thin film 15 that is formed on a substrate 14 is irradiated as the beam travels in the direction of the arrow X (scanning irradiation). Excimer laser annealing apparatuses that give a line beam (e.g., the line beam L) with a beam width (line beam width LW) of 465 mm are produced in a commercial scale. Further, an irradiation technique with which the entire target surface is irradiated with a planar laser beam at once has also been researched and developed.

In addition to the method that uses a laser of this type, Japanese Unexamined Patent Publication No. 2004-134577, for example, discloses a laser crystallization method in which a laser beam absorption layer that is made from an alloy containing Cr, Mo, or the like, or that has a layered structure thereof is formed on an amorphous silicon thin film by vacuum deposition or sputtering, and the absorption layer is then irradiated with a semiconductor laser beam for heating and crystallizing the amorphous silicon thin film.

However, the conventional laser crystallization methods are problematic in that since the substantially entire surface of an amorphous silicon thin film is irradiated with a laser beam in the form of a line beam as the beam travels across the surface, heat generated by the beam creates stress in the glass or silicon substrate, resulting in cracking or warping.

To alleviate the thermal effect on the substrate, it is effective to crystallize only the specific areas of an amorphous silicon thin film necessary for forming a thin-film transistor or a like device; however, it is difficult in a method in which the entire surface is irradiated with a line beam of a laser, such as an excimer laser, to crystallize only the specific areas of the amorphous silicon thin film because the surface of the amorphous silicon thin film is entirely crystallized (polysilicon formation) and then patterning is performed by exposure/development according to a photolithographic method.

SUMMARY OF THE INVENTION

Hence, a principal object of the present invention is to provide a laser crystallization method that can crystallize only the desired, specific local areas of an amorphous silicon thin film in which a thin-film transistor, wiring, or the like is to be formed.

To achieve the aforementioned object, the present invention provides a laser crystallization method in which an amorphous silicon thin film formed on a substrate is irradiated with a laser beam for crystallization. The method includes the steps of applying a fluid that contains an absorbent that absorbs a laser beam to a desired, specific local area of the amorphous silicon thin film to form an absorbent layer thereon, and laser annealing for crystallizing the specific local area of the amorphous silicon thin film by irradiating the amorphous silicon thin film including the specific local area with a semiconductor laser beam having a specific wavelength absorbable by the absorbent layer and unabsorbable by the amorphous silicon thin film for heating the absorbent layer.

According to the present invention, an absorbent layer is printed in desired areas on an amorphous silicon thin film that encompass the specific local areas where a thin-film transistor, wiring, or the like is to be formed and the amorphous silicon thin film including the specific local areas is irradiated with a laser beam that can be absorbed by the absorbent layer and cannot be absorbed by the amorphous silicon thin film, so that only the absorbent layer portion locally provided on the amorphous silicon thin film is heated and crystallized and the amorphous silicon thin film portion not provided with the absorbent layer is not heated, and therefore the warping or cracking of the substrate can be prevented.

DETAILED DESCRIPTION OF THE INVENTION

An embodiment of the laser crystallization method according to the present invention is described below with reference to FIGS. 1 to 3.

Figure 1:
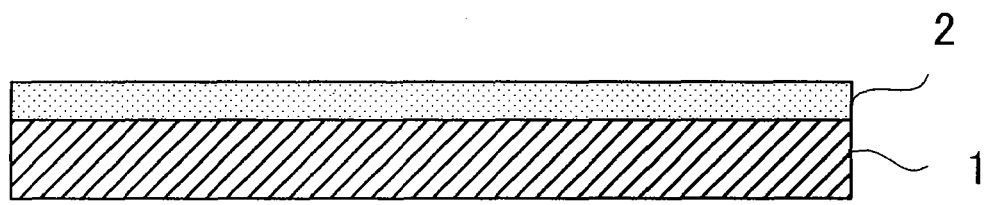
FIG. 1 is an explanatory drawing showing one step of the laser crystallization method according to the present invention.

First, as shown in FIG. 1, an amorphous silicon thin film 2 is formed on a glass substrate 1 according to plasma-enhanced chemical vapor deposition (PECVD), which is a conventional method of film forming. A silicon substrate may serve as the substrate 1 for reflection-type LCDs.

Figure 2:
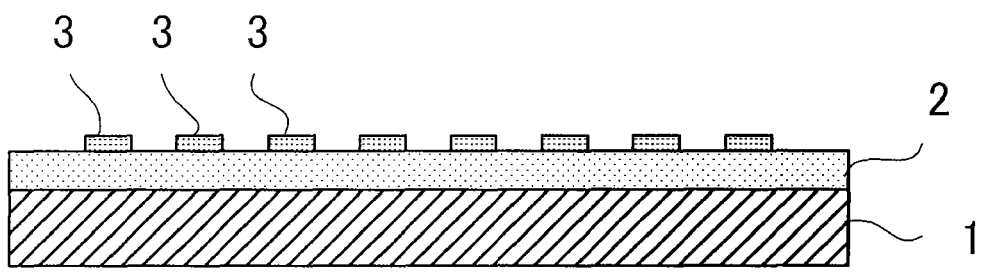
FIG. 2 is an explanatory drawing showing the step following that of FIG. 1.

Next, as shown in FIG. 2, absorbent layers 3 are formed (pattern-printed) by screen printing in specific local areas of the amorphous silicon thin film 2 encompassing the areas where thin-film transistors (TFTs) are to be formed. The absorbent layers 3 are printed over areas slightly larger than the areas where thin-film transistors are to be formed. The method for printing the absorbent layers 3 are preferably screen printing in terms of cost and productivity. However, the method is not particularly limited insofar as it allows the desired pattern to be readily printed, and applicable examples include pad printing, ink-jet printing, and like printing methods.

The material of the absorbent layers 3 is not particularly limited insofar as it is printable and sufficiently absorbs a laser beam when irradiated. The absorbent layers 3 can be formed by, for example, applying to the substrate an absorbent-containing fluid prepared by dispersing in a dispersion medium such as water or an organic solvent an infrared absorbent or a near-infrared absorbent that can absorb a semiconductor laser (wavelength: about 0.6 to 1.8 µm) or an absorbent containing carbon black, amorphous carbon, or the like that absorbs a laser of any wavelength, or by partially dissolving such an absorbent in such a dispersion medium. Various different organic and inorganic powders are commercially available that can served as the infrared absorbent or the near-infrared absorbent. Carbon black ink is usable as the carbon black dispersion, and India ink is usable as the amorphous carbon dispersion. Once the aforementioned absorbent-containing fluid is applied, the absorbent layers 3 are thermally dried or air-dried.

The thickness of the absorbent layers 3 applied is varied depending on the type of the material of the absorbent layers 3, the output of a laser beam, and other factors, but an example may be 0.1 to 0.8 µm when a carbon dispersion is used.

The absorbent layers 3 are cured by a method suitable according to the type of absorbent, and generally cured by air-drying.

A laser beam for use is a beam that cannot be absorbed by the amorphous silicon thin film 2. The laser beam is of a semiconductor laser, which costs lower than an excimer laser or a YAG laser. Since the amorphous silicon thin film 2 has an absorption maximum between 400 and near 550 nm and does not absorb a beam having a wavelength of 700 nm or greater, the laser beam L for irradiation is configured to have a wavelength of 700 nm or greater and, therefore, an infrared semiconductor laser can be used as a preferable laser beam source. A near-infrared semiconductor laser and a far-infrared semiconductor laser are both usable. The infrared semiconductor laser may use, for example, a continuous-wave laser beam (i.e., continuous light) having a maximum energy of 4 W and an irradiation energy density of 2.5 to 3.5 J/cm$^2$.

Figure 3:
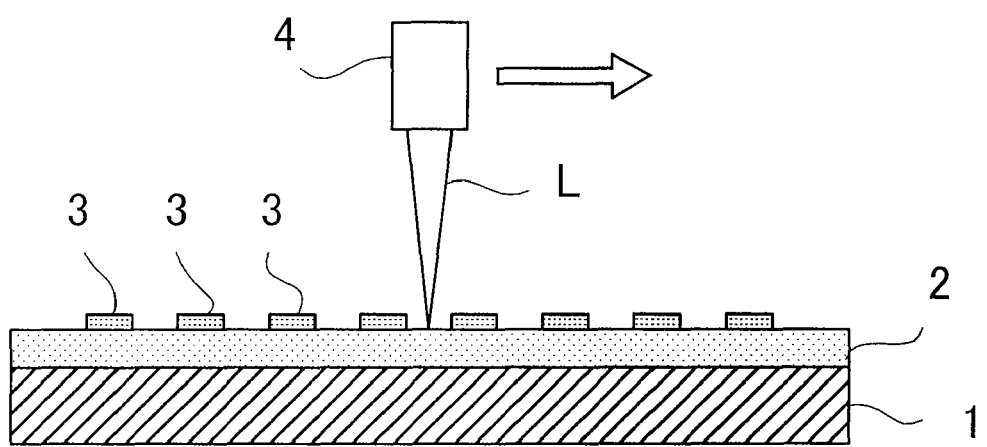
FIG. 3 is an explanatory drawing showing the step following that of FIG. 2.

After the absorbent layers 3 are formed as described above, the laser beam L is emitted from a laser oscillator 4 as shown in FIG. 3. A method in which a line beam created by constructing an optical system, as in a conventional method, is emitted such that the beam travels across the surface for irradiation (scanning irradiation) may be employed as the irradiation method. A known line beam-emitting laser oscillator that uses, for example, a rod lens, a cylindrical lens, a Powell lens, or the like may be used as the laser oscillator for producing a line beam. An irradiation technique with which the entire target surface is irradiated with a planar laser beam at once may be employed in place of the irradiation with a line beam. The oscillator 4 may be moved in the arrowed direction in FIG. 3 while the irradiation with the laser beam L is performed. Alternatively, the substrate 1 may be moved in the opposite direction.

The substantially entire surface of the amorphous silicon thin film 2 including the specific local areas where the absorbent layers 3 are provided may be irradiated with the laser beam L.

When the laser beam L is emitted in the above-described manner, only the absorbent layers 3 absorb the laser beam L while the amorphous silicon thin film 2 and the glass substrate 1 transmit the laser beam L. The energy absorbed by the absorbent layers 3 is radiated as heat, thereby heating and annealing the amorphous silicon thin film 2 disposed under the absorbent layers 3. Therefore, only the specific local areas of the amorphous silicon thin film 2 on which the absorbent layers 3 are provided are crystallized.

As described above, the proportion of the crystallized portions relative to the entire amorphous silicon thin film 2 is small and, therefore, the total amount of heat generated is substantially reduced in comparison with conventional methods in which the entire amorphous silicon thin film is crystallized, and the warping or cracking of the substrate 1 can thus be prevented.

According to the present invention, thermal effects on the substrate 1 are alleviated, thereby allowing the extent of crystallization (for example, particle size) to be controlled by the amount of heat generated, and therefore, the extent of crystallization can be more liberally controlled and the efficiency of a thin-film transistor, such as carrier mobility, can be improved. Accordingly, the applicability of a laser crystallization method to TFT liquid-crystal panels is broadened, and the advantage of a crystallization method that uses a low-cost semiconductor laser can be exercised to the greatest extent.

Figure 4:
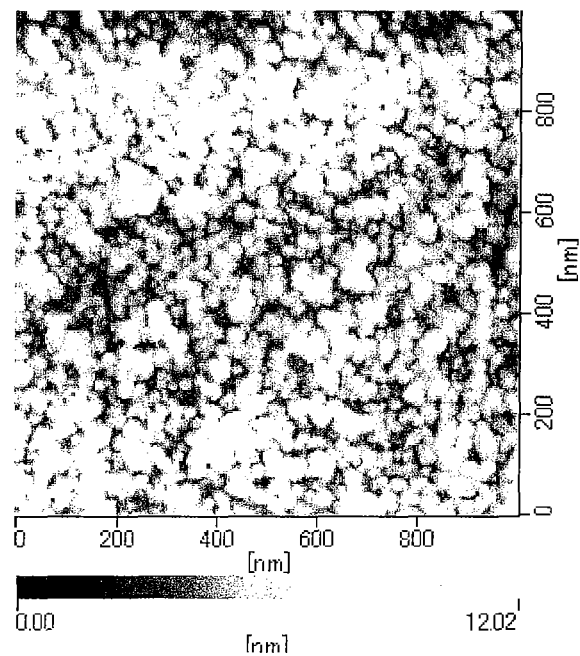
FIG. 4 shows an AFM picture of amorphous silicon crystallized by the laser crystallization method according to the present invention.
Figure 5:
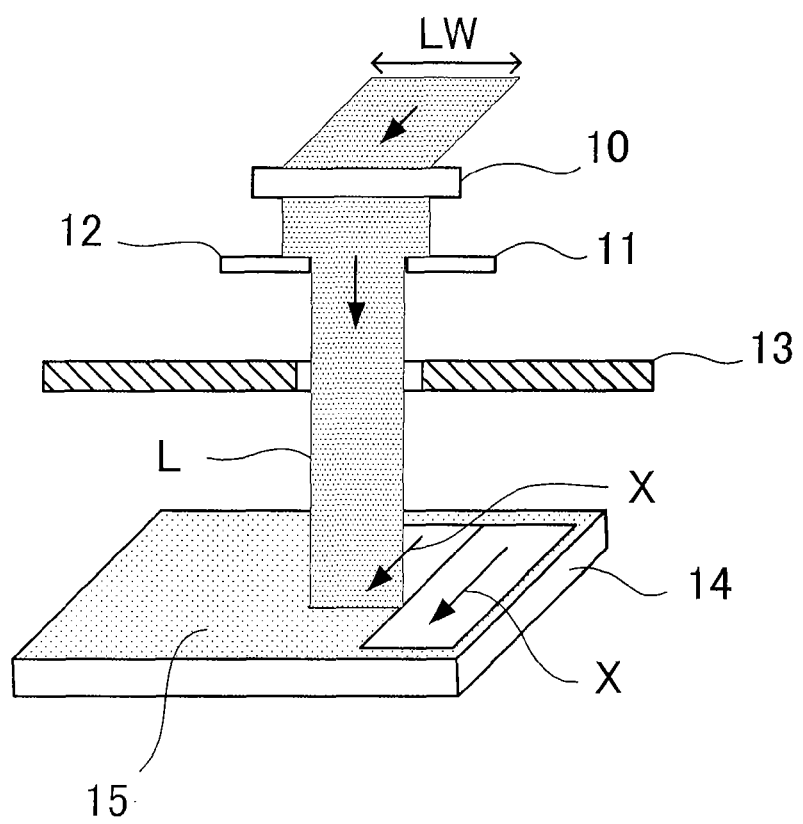
FIG. 5 is an explanatory drawing showing the principal part of a conventional excimer laser annealing apparatus.

For a working example of the present invention, an amorphous silicon thin film having a thickness of 50 nm was formed on a glass substrate using plasma-enhanced chemical vapor deposition, carbon black ink was suitably applied to the amorphous silicon thin film and dried at ordinary temperatures for 10 minutes, the amorphous silicon thin film was irradiated with an infrared laser beam having a diameter 0.5 mm, an output of 12 W, and an output density of 6.2 kW/cm$^2$ while moving the scanning stage at a rate of 310 mm/sec to crystallize the amorphous silicon thin film. An infrared semiconductor laser oscillator DuO (manufactured by Coherent Japan) was used. FIG. 4 shows an AFM picture of a portion where crystallization was performed. When scanning irradiation with a laser beam is carried out, there are portions where a laser beam is given multiple times. However, the picture provided in FIG. 4 shows that the portions that received multiple laser beam irradiation cannot be distinguished from the portions where no multiple irradiation was given, and uniform crystallization was attained with a particle size of about 10 to 20 nm.

What is claimed is:

1. A laser crystallization method for crystallizing an amorphous silicon thin film formed on a substrate using a laser beam,
the method comprising the steps of:
applying a fluid comprising an absorbent that absorbs a laser beam to a desired, specific local area of the amorphous silicon thin film to form an absorbent layer thereon, and
laser annealing for crystallizing the specific local area of the amorphous silicon thin film by irradiating the amorphous silicon thin film including the specific local area with a semiconductor laser beam having a specific wavelength absorbable by the absorbent layer and unabsorbable by the amorphous silicon thin film for heating the absorbent layer.

2. The laser crystallization method according to claim 1, wherein in the step of laser annealing, the laser beam is a beam of an infrared semiconductor laser, and the absorbent layer comprises an infrared absorbent.

* * * * *